United States Patent [19]

Ito

[11] Patent Number: 6,049,080

[45] Date of Patent: Apr. 11, 2000

[54] PYROELECTRIC INFRARED SENSOR DEVICE

[75] Inventor: Satoru Ito, Hakui, Japan

[73] Assignee: Murata Manufacturing Co., Ltd., Japan

[21] Appl. No.: 08/957,536

[22] Filed: Oct. 29, 1997

[30] Foreign Application Priority Data

Oct. 30, 1996 [JP] Japan .................................. 8-305954

[51] Int. Cl.[7] ...................................................... G01J 5/02
[52] U.S. Cl. ........................................................ 250/338.3
[58] Field of Search .......................................... 250/338.3

[56] References Cited

U.S. PATENT DOCUMENTS

| 4,225,786 | 9/1980 | Perlman | 250/342 |
| 5,095,215 | 3/1992 | Shorrocks et al. | 250/338.1 |

FOREIGN PATENT DOCUMENTS

| 299796 | 5/1992 | Germany . | |
| 60-213827 | 10/1985 | Japan | 250/338.3 |
| 62-123324 | 6/1987 | Japan | 250/338.3 |
| 7-198478 | 8/1995 | Japan . | |

OTHER PUBLICATIONS

German Office Action dated Dec. 21, 1998 and English–language translation.
Soviet Patents Abstracts Section S, Week 9502, London: Derwent Publications Ltd., Class S03, AN 95–012848/02, SU 1827552 A (Mosc/Bauman Tech College), Feb. 10, 1995.
Patent Abstracts of Japan, vol. 18, No. 519 (P–1807), Sep. 29, 1994, JP 6–180252 A (Murata) Jun. 28, 1994.

Austrian Search Report dated Apr. 30, 1998.

*Primary Examiner*—Constantine Hannaher
*Attorney, Agent, or Firm*—Ostrolenk, Faber, Gerb & Soffen, LLP

[57] ABSTRACT

A pyroelectric infrared sensor device with improved sensitivity and relative detection rate and reduced manufacturing cost. The infrared sensor device includes a substrate of rectangular shape. The substrate is made of a pyroelectric material, such as tetragonal-system lead titanate pyroelectric ceramics. A pair of comb-shaped electrode patterns each having a set of parallel conductive open-ended fingers are disposed on the top surface of the substrate such that the open-ended fingers of one electrode pattern are spatially interdigitated in relation to those of the other. The paired comb-shaped electrodes have at least three finger pairs whereas the interelectrode distance corresponding to the gap between neighboring fingers is greater than 100 micrometers. These comb-shaped electrodes satisfying the criteria render the pyroelectric material, upon application of a DC voltage between them, substantially horizontally polarizable at or near the top substrate surface which acts as the infrared light receiving plane. An opposite electrode is on the entire bottom surface of the substrate. This electrode has portions insulatively overlapping the comb-shaped electrodes with the pyroelectric material being sandwiched therebetween.

18 Claims, 15 Drawing Sheets

PYROELECTRIC INFRARED SENSOR DEVICE

BACKGROUND OF THE INVENTION

1. Field of the Invention

The present invention relates generally to solid-state microelectronics, and more particularly to pyroelectric radiation sensitive devices. The invention also relates to pyroelectric infrared light sensor structures adaptable for use with sensor packages or modules for detecting the presence of a human body in several applications including, but not limited to, alarm systems, intelligent air conditioners, auto-adjustable illumination apparatus, and auto power-on audio systems.

2. Description of the Related Art

One conventionally known pyroelectric infrared sensor device is designated by the numeral 1 in FIG. 11. This infrared sensor device 1 includes electrodes 2a, 3a which are formed on the top and bottom surfaces of a rectangular-shaped pyroelectric body 1a with polarization being vertically effected between the electrodes 2a, 3a along the thickness as indicated by arrows shown. The electrodes 2a, 3a are disposed in the direction at right angles to the polarization direction.

In this conventional pyroelectric infrared sensor device 1, when rays of infrared light 9 are radiated from an object to be detected and are then incident on the light-receiving surface of the sensor device 1, slight temperature changes will occur in the pyroelectric body 1a. As a result, a packet of electrical charge carriers that has been accumulated on the surface of pyroelectric body 1a in the equilibrium state—i.e, A surface charge—might move, causing a voltage to arise accordingly. This voltage is usable in detecting the object to be detected by electrically amplifying it with impedance converter circuitry employing field effect transistors (FETs), by way of example, and then converting an amplified signal into a corresponding electrical signal.

Another conventional pyroelectric infrared sensor device is shown in FIGS. 12A to 12C, wherein this device is also designated by numeral 1. FIG. 12A is a plan view of the sensor device 1, FIG. 12B shows its side view, and FIG. 12C is the bottom view thereof.

As shown in FIG. 12A, the conventional pyroelectric infrared sensor 1 includes a substrate 2 made of a pyroelectric material. The pyroelectric substrate 2 has a top surface on which a pair of light-receiving electrodes 3a, 3b are disposed along with an interconnection electrode 4 connecting between them. As best shown in FIG. 12C, pyroelectric substrate 2 has a bottom surface on which a pair of spaced-apart electrodes 5a, 5b are formed overlapping the light-receiving electrode pair 3a, 3b on the top substrate surface. In the pyroelectric infrared sensor 1, polarization has been effected along the thickness direction of pyroelectric substrate 2.

One typical pyroelectric infrared sensor module 101 employing the pyroelectric infrared sensor device of FIG. 12 is shown in FIG. 13. This conventional pyroelectric infrared sensor module 101 includes a holder plate 102 which is manufactured by two-color formation techniques or electrode-on-ceramics formation techniques. The holder plate 102 has a surface with complicated configuration, on which a resistor chip 103 and an FET chip 104 as well as a pyroelectric infrared sensor device 105 are mounted. The holder plate 102 with resistor 103, FET 104 and sensor 105 mounted thereon is then attached to a support base 106. This base 106 is assembled for packaging with a cap 107 having on its top surface a light entrance window. The assembled sensor module 101 thus contains therein the electronics components 103 to 105 in an environmentally sealed manner.

Another conventional pyroelectric infrared sensor module 201 is shown in FIGS. 14A to 14C. This pyroelectric infrared sensor module makes use of the pyroelectric infrared sensor device of FIG. 12. Note here that FIG. 14A shows a plan view of the sensor module, FIG. 14B is its side view, and FIG. 14C is a bottom view of a holder plate 202 used in the module.

As shown in FIGS. 14A to 14B, the conventional pyroelectric infrared sensor module 201 comes with a pyroelectric infrared sensor device 205 which is attached on the upper surface of the holder plate 202. This holder plate has a lower surface on which a hightemperature resistance element 203 is mounted by conductive adhesion. The resistance element 203 is of the high-temperature baked type using carbon, thermet, a resistive material made of ruthenium oxide, or the like. An FET chip 204 is also mounted on the lower surface of holder 202 as shown in FIG. 14C. This holder plate 202 is attached to a support base 206 so that holder plate 202 is stably positioned over base 206 as best shown in FIG. 14B. A cap with a light entrance window (not shown) is assembled thereto for packaging.

In the conventional sensor modules 101, 201 employing the pyroelectric infrared sensor device 1, it is strictly required that the pyroelectric device per se be minimized in thickness while at the same time maximizing thermal insulation characteristics in order to improve the relative detection rate indicative of the characteristics of pyroelectric device. To maximize thermal insulation characteristics, it has been required that the light entrance section to which incoming rays of infrared light are introduced be formed into a hollow shape as shown in FIGS. 13A to 13C and 14A to 14C. To this end, it has been necessary to reduce or minimize the thermal capacity and thermal time constant of the prior art sensor modules 101, 201 for achievement of enhanced relative detection ratio.

In other words, with the conventional pyroelectric infrared sensor modules 101, 201, since polarization is principally carried out along the thickness direction of the sensor substrate, an attempt has been made to minimize the thermal capacity by forcing the device per se to decrease in thickness. This would result in a decrease in mechanical or physical strength while simultaneously reducing durability against thermal shocks applied thereto.

As far as performance is concerned, the pyroelectric body can directly receive external vibrations, mechanical shocks, and thermal shocks due to strong infrared light illumination, causing the pyroelectric infrared sensor device per se to receive mechanical vibrations, which in turn results in occurrence of noise. This might reduce the signal-to-noise (S/N) ratio degrading or lowering performance.

In short, since the thickness of pyroelectric infrared sensor device is reduced, rendering the resultant structure mechanically weakened, the mechanical and thermal reliability is undesirably degraded thus making the handling of pyroelectric infrared sensor devices very difficult.

In addition, the reduction in thickness of pyroelectric devices can increase the risk of occurrence of malfunctions due to the piezoelectric effect of the pyroelectric body per se. This might lead to a reduction in reliability. Therefore, it is difficult for the prior art pyroelectric infrared sensor modules 101, 201 to attain excellent performance with the S/N ratio enhanced.

With regard to fabrication, the mechanical or physical weakness of the pyroelectric body per se renders difficult both rigid support of the pyroelectric device and its retention in an accurate position during fabrication. More practically, it becomes difficult to accurately mount and support the pyroelectric sensor device by adhesion on an associated substrate at an intended location. This would also affect performance.

A further problem encountered with the conventional techniques is that specific thermal insulation (thermal resistivity) schemes are required for rendering the light-receiving section hollow in shape thus making it unable to easily form the pyroelectric light-receiving section. Moreover, because in most cases the thickness of the pyroelectric body per se is designed to fall within the range of 70 to 100 micrometers, for example, the resulting yield of production is lowered rendering extremely difficult the manufacture of such pyroelectric infrared sensor device itself.

A still further problem faced with the conventional techniques is an increase in manufacturing cost due to an increase in the number of parts or components required. More specifically, in the sensor modules 101, 201 of FIGS. 13A to 14C, necessary parts or components are increased in number due to the necessity of making use of the holder plate 102 or 202 with the high-temperature resistance element 203 formed thereon, for attachment of the resistor chip 103 thereto.

One conventional approach to avoidance of such problems is to employ a pyroelectric infrared sensor device 5 shown in FIG. 15. This sensor device 5 has an electrode arrangement forcing the polarization of pyroelectric body to be concentrated only at or near the infrared light incidence surface thereof. This structure is advantageous in view of the fact that the surface layers near the light-receiving surface contribute most of the output of the pyroelectric infrared sensor device.

More specifically, the conventional pyroelectric infrared sensor device 5 of FIG. 15 includes a pyroelectric body or substrate 6 of a rectangular shape, for example. Substrate 6 has a surface on which two electrodes 7, 8 are formed in such a manner that these oppose each other with a predetermined distance D being defined therebetween. Polarization treatment has been effected in advance between the two electrodes 7, 8 by application of a dielectric current (DC) voltage thereto. In this case, polarization tends to mostly occur at nearby portions of the substrate surface acting as the radiation receiving plane, causing the direction of polarization to be parallel with the infrared-light (9) incidence surface. In other words, the polarization direction is set identical to the "x" axis direction in FIG. 15. With such an arrangement, this conventional sensor device 5 is advantageous over those of FIGS. 11 to 12 in that the former enables polarization of pyroelectric body 6 to be concentrated only at or near the light-receiving surface of the pyroelectric substrate 6, which in turn leads to an improvement in relative detection rate.

Unfortunately, the above advantage of the conventional pyroelectric infrared sensor device 5 shown in FIG. 15 does not come without accompanying serious problems, which follow. While it is no longer necessary to make thinner the pyroelectric substrate per se, the area of its light-receiving section as well as th e electric capacitance (electrostatic capacitance) thereof remain less, rendering it difficult to obtain a sufficient pyroelectric current while also placing certain limitations on the possible improvement in sensitivity and in relative detection rate. Another problem in the conventional techniques is that the electric capacitance (electrostatic capacitance) remains smaller so that high-frequency noise components such as white noise are increased undesirably.

On the other hand, pyroelectric infrared sensor devices employing comb-shaped electrodes placed on pyroelectric substrates have been proposed. This kind of pyroelectric infrared sensor is disclosed in Japanese laid-open publication No. 7-198478. It has advantages, but is not able to avoid the foregoing disadvantages of conventional pyroelectric infrared sensor devices.

SUMMARY OF THE INVENTION

The present invention advantageously provides an improved pyroelectric infrared sensor device having comb-shaped electrodes and a sensor module structure employing the same.

Another advantage of the invention is that the pyroelectric infrared sensor device having comb-shaped electrodes is capable of avoiding the problems faced by the conventional techniques and also by sensor modules making use of the same.

It is a further advantage that the improved pyroelectric infrared sensor device having comb-shaped electrodes is capable of further improving the sensitivity and relative detection rate while simultaneously enabling mass production at low cost.

To attain the foregoing advantages, the disclosed pyroelectric infrared sensor device includes a substrate made of a pyroelectric material, comb-shaped electrodes formed as a pair on one principal plane of the substrate serving as an infrared light sensitive surface, and an electrode formed on the opposite principal plane of the substrate and having a portion insulatively overlapping the comb-shaped electrodes. Each comb-shaped electrode may have three or more electrode-pairs, allowing the pyroelectric material to be polarized upon application of an appropriate voltage.

With the principles of the invention, since the substrate is polarized by the comb-shaped electrodes, thermal or heat energy of incoming infrared light is captured only at the one principal surface of the substrate serving as the infrared light receiving plane. Accordingly, an intended pyroelectric current may be obtainable due to heat exchange only at or near such one principal surface of the substrate.

In addition, since the opposite electrode disposed on the remaining principal plane of the substrate has a certain portion opposing or overlapping the comb-shaped electrodes, it becomes possible to improve dipole concentration between the comb-shaped electrodes, which may in turn increase the polarization rate of the substrate. This has been found out by simulation results using the finite element method. It is also possible by increasing the polarization rate of the substrate to increase the electrical capacitance (electrostatic capacitance) of the device structure of the pyroelectric infrared sensor.

Furthermore, use of the comb-shaped electrodes may increase the area of opposing electrode portions whereby the current path increases so that electric resistance decreases accordingly.

In accordance with one aspect of the invention, a plurality of comb-shaped electrode pairs are connected in series or in parallel on the top surface of the substrate. These comb-shaped electrode pairs are connected in serial or parallel manner constituting a plurality of light-receiving elements on the infrared light receiving surface. Any desired pyroelectric current is obtainable due to heat exchange at or near substantially only the one principal plane of the substrate acting as the infrared light receiving surface. It is thus possible to suppress or eliminate crosstalk between adjacent ones of the light-receiving elements concerned.

In accordance with another aspect of the invention, at least one comb-shaped electrode pair has parallel open-ended finger portions with variable interval or pitch therebetween. Use of such variable finger pitch in the comb-shaped electrodes may render variable the amount of infrared light energy incident every time when it crosses successive fingers of each electrode. Due to this, the time period spanning from incidence of infrared light to issuance of a corresponding output electrical signal—namely, the time constant—may increase or decrease accordingly.

In accordance with a further aspect of the invention, the interelectrode distance of each comb-shaped electrode is specifically selected so as to exceed 100 micrometers. With this numerical setting, the sensitivity may be further enhanced.

One significant advantage of the instant invention is that it is possible to provide a pyroelectric infrared sensor device capable of further improving the sensitivity and relative detection rate while simultaneously enabling mass production at low cost. More specifically, it is possible by employing the electrode having a certain portion opposing the comb-shaped electrodes to increase the polarization rate thus enabling the electrical capacitance (electrostatic capacitance) to further increase. It is thus possible to provide increased pyroelectric current while enhancing the S/N ratio, thereby improving the sensitivity and relative detection rate.

Another advantage of the invention is that it is able to render the pyroelectric infrared sensor characteristics independent of the direction of the substrate thickness, thereby making it unnecessary to have to reduce the thickness of a pyroelectric substrate per se. Therefore, the mechanical and thermal strength may be enhanced, so that degradation of electrical characteristics otherwise occurring due to poor mechanical and thermal strength may be eliminated.

Still another advantage of the invention is that the comb-shaped electrodes are formed on the one principal plane of the substrate making it possible to fabricate electrical circuitry directly on the infrared light receiving surface with such circuitry being integral with the substrate. Furthermore, presently available lithography techniques widely employed in the IC manufacturing field may also be employed to form such comb-shaped electrodes, enabling microfabrication of any intended infrared light receiving section with reduced complexity. Moreover, avoiding the necessity of employing an extra-thin pyroelectric substrate as in the conventional techniques makes it unnecessary to make use of any additional support substrate for rigid support of the pyroelectric substrate while at the same time reducing complexity in support structure and in its thermal insulation scheme.

Again, reducing the complexity of the manufacturing methodology and reducing the number of required parts or components makes it possible to provide a pyroelectric infrared sensor device with excellent electrical reliability and manufacturability and with reduced manufacturing cost.

A further advantage of the invention is as follows. A plurality of light receiving elements are constituted which are connected in series or in parallel on the infrared light receiving surface while simultaneously enabling creation of pyroelectric current due to heat exchange at or near substantially only the one principal plane of the substrate which acts as the infrared light receiving surface; as a consequence, any crosstalk that may occur between the light receiving elements can be suppressed. Therefore, it is possible, by appropriate optical treatments such as optical chopping for example, to provide one-dimensional images or two-dimensional images with less crosstalk. This may in turn improve the detection accuracy of a target object being detected.

A still further advantage is that since the time constant may be rendered longer by use of variable finger pitch comb-shaped electrodes, where an object under detection is a human body for example, slow or moderate movements thereof may be successfully detected with enhanced accuracy.

These and other objects, features and advantages of the invention will be apparent from the following more particular description of embodiments of the invention, as illustrated in the accompanying drawings.

BRIEF DESCRIPTION OF THE DRAWINGS

FIGS. 5A and 5B are graphs each showing the relationship of the sensitivity of the infrared sensors of FIGS. 3 and 4 versus the number of finger pairs N in the comb-shaped electrodes, wherein FIG. 5A shows variations of the sensitivity when the interelectrode distance a and interelectrode pitch b are changed and the intersection width W is kept constant, whereas FIG. 5B shows the same when W is changed and a, b are unchanged.

FIGS. 12A to 12C show another conventional pyroelectric infrared sensor device, wherein FIG. 12A is its plan view, FIG. 12B is its side view, and FIG. 12C is a bottom view thereof.

FIGS. 14A to 14C show another conventional pyroelectric infrared sense module employing the sensor device shown in FIGS. 12A to 12C, wherein FIG. 14A is its plan view, FIG. 14B is its side view, and FIG. 14C is a bottom view of a holder plate used therein.

DETAILED DESCRIPTION OF EMBODIMENTS OF THE INVENTION

Figure 1:
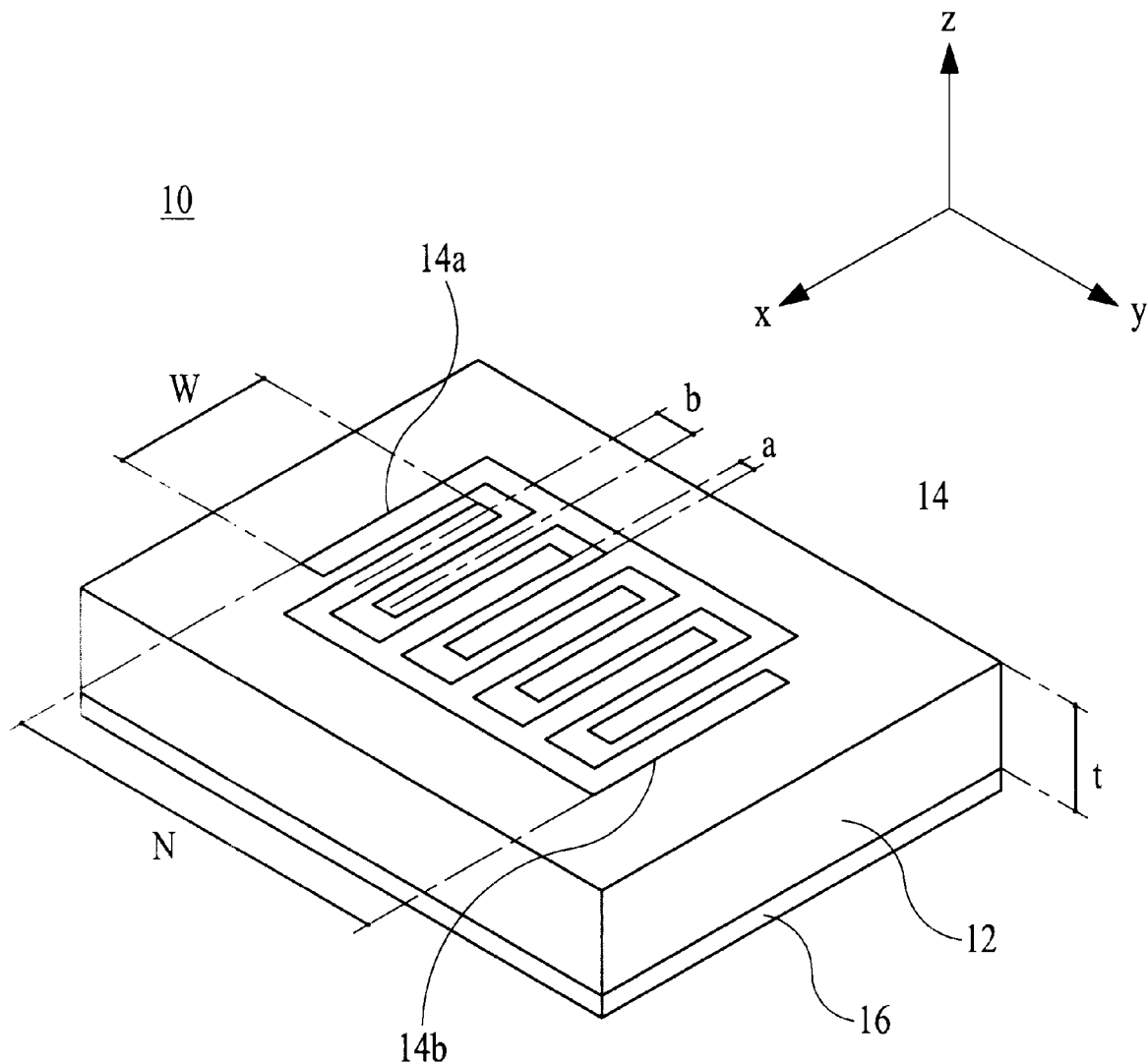
FIG. 1 is a diagram showing a perspective view of a pyroelectric infrared light sensitive device in accordance with a first embodiment of the present invention.

Referring to FIG. 1, a pyroelectric infrared sensor device in accordance with a first embodiment is generally designated by numeral 10. This sensor device 10 includes a substrate 12 of a rectangular shape with the thickness t. The substrate 12 may be made of a chosen pyroelectric material. Preferably, this material is lower in pyroelectricity along the thickness of substrate 12 than along its surface in order to provide a greater output voltage at the surface of substrate 12. This may be met by use of tetragonal-system lead titanate pyroelectric ceramics for substrate 12.

A pair of comb-shaped electrode patterns 14 are disposed on the top surface of the substrate 12 in such a manner that each has a specifically selected number of substantially equally spaced, parallel conductive open-ended "finger" portions. More specifically, one comb-shaped electrode 14 is patterned to have five equal-spaced, open-ended fingers 14a which are consecutively shorted to each other at one end and remain unconnected at the other end. Likewise, the other comb-shaped electrode 14 has five open-ended fingers 14b. These electrode fingers 14a, 14b are spatially interdigitated in relation to each other with a certain gap defined therebetween as shown in FIG. 1. The comb-shaped electrodes 14 are such that the number of finger pairs N is set at five (5) while the interelectrode distance is represented by a, the interelectrode pitch is b, and the electrode interdigitation width is W. The interelectrode distance a, as used herein, may refer to the distance or gap between the fingers 14a and 14b of the comb-shaped electrodes 14. The interelectrode pitch b used herein refers to the center-to-center distance of each neighboring pair of interdigitated fingers 14a and 14b. The electrode interdigitation width W refers to the length of overlapping portions of such interdigitated fingers 14a, 14b on substrate 12 as may be readily seen from FIG. 1.

The pyroelectric substrate 12 has an opposite or bottom surface which is entirely covered with a conductive layer 16, forming a further electrode. This bottom-surface electrode 16 is insulatively overlapping the comb-shaped electrode pair 14 along the thickness of pyroelectric substrate 12 so that it includes portions opposing the comb-shaped electrodes 14 on the top substrate surface with substrate 12 being sandwiched therebetween.

In this embodiment the pyroelectric substrate 12 is made of $(Pb_xCa_{1-x})\{(Ni_{1/3}Nb_{2/3})_{1-y}Ti_y\}O_3$-based pyroelectric ceramics. Substrate 12 may measure 0.30 to 0.50 millimeters (mm) in thickness t. Preferably, the comb-shaped electrodes 14 and opposite electrode 16 are made of metals of good conductivity, such as gold (Au), silver (Ag) or aluminum (Al). Alternatively, these electrodes may be made of an alloy of nickel (Ni), chromium (Cr) and the like. Note here that in order to increase the sensitivity of the device, in practice, a heat absorption film or heat sink layer (not shown herein) may be additionally provided on the exposed surfaces of electrodes 14, 16 when appropriate.

In the pyroelectric infrared sensor device 10 shown in FIG. 1, the top surface with the comb-shaped electrode pair 14 formed thereon serves as the radiation sensitive plane for receipt of incoming rays of infrared light as radiated from an object being detected. In this infrared sensor device 10, upon application of a DC voltage between the interdigitated electrode fingers 14a and 14b, the comb-shaped electrode pair 14 polarizes the underlying pyroelectric substrate material in a selected direction identical to the Y axis direction in FIG. 1. The polarization may be done by applying a DC voltage of from 2.0 to 4.0 kilovolts per millimeter (kV/mm) between fingers 14a, 14b of comb-shaped electrode pair 14 for sixty (60) minutes at temperatures of from 100 to 150° C.

Figure 2A:
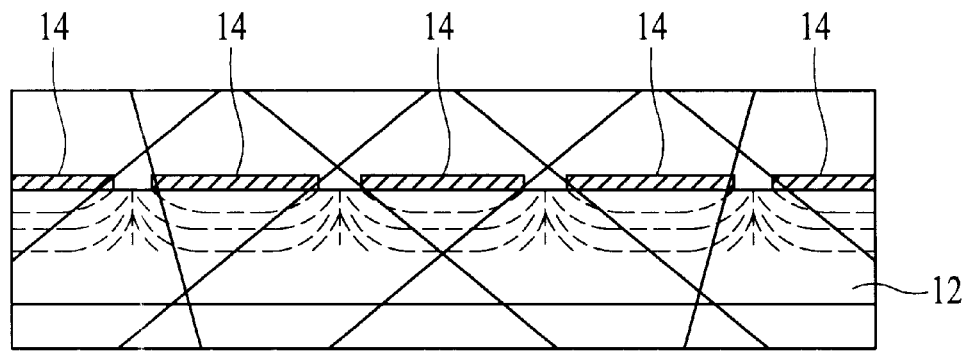
FIG. 2A is a diagrammatic representation, using a simulation by the finite element method, of the distribution of an electric field as created in a substrate of the infrared sensor device shown in FIG. 1 with no opposite electrode on its bottom.
Figure 2B:
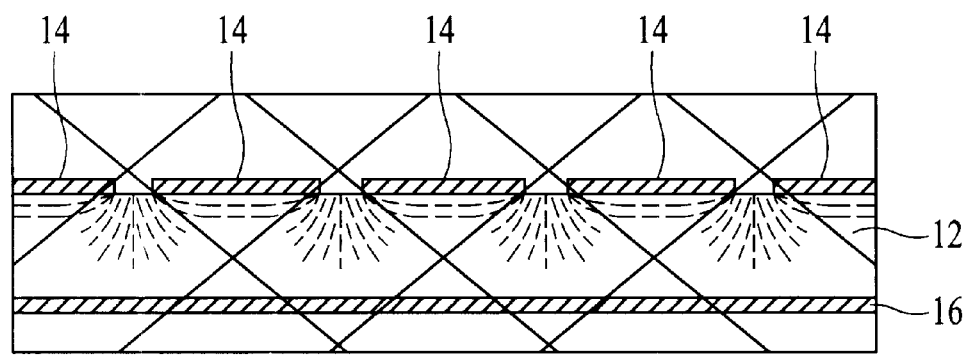
FIG. 2B is a diagrammatic representation of the distribution of an electric field in a substrate with an opposite electrode employed on its bottom.

See FIGS. 2A and 2B. These figures demonstrate the results of experimental simulation as to dipole concentration for analyzing how the internal electric field is created inside the pyroelectric substrate 12 of FIG. 1. More specifically, FIG. 2A is a diagrammatic representation, using a simulation by the finite element method, of the distribution of an electric field created in substrate 12 in the case where the opposite electrode 16 insulatively overlapping comb-shaped electrodes 14 is not provided; and, FIG. 2B is a diagrammatic representation, using such simulation by the finite element method, of the distribution of an electric field created in substrate 12 with the bottom-surface electrode 16 opposing comb-shaped electrodes 14 disposed thereon.

As may be readily seen by those skilled in the art from viewing FIGS. 2A to 2B, the simulation results reveal the fact that it is possible, by forming the bottom-surface electrode 16 having portions opposing the comb-shaped electrodes 14 on the top surface of substrate 12, to improve the dipole concentration between the spatially interdigitated fingers 14a, 14b of comb-shaped electrode pair 14 nearby the top substrate surface. To this end, with the pyroelectric infrared sensor device 10 of FIG. 1, the opposite electrode 16 is formed on the entire bottom surface of the substrate 12 in order to enhance the dipole concentration with respect to the fingers 14a, 14b of comb-shaped electrodes 14 while improving the polarization rate.

Figure 3:
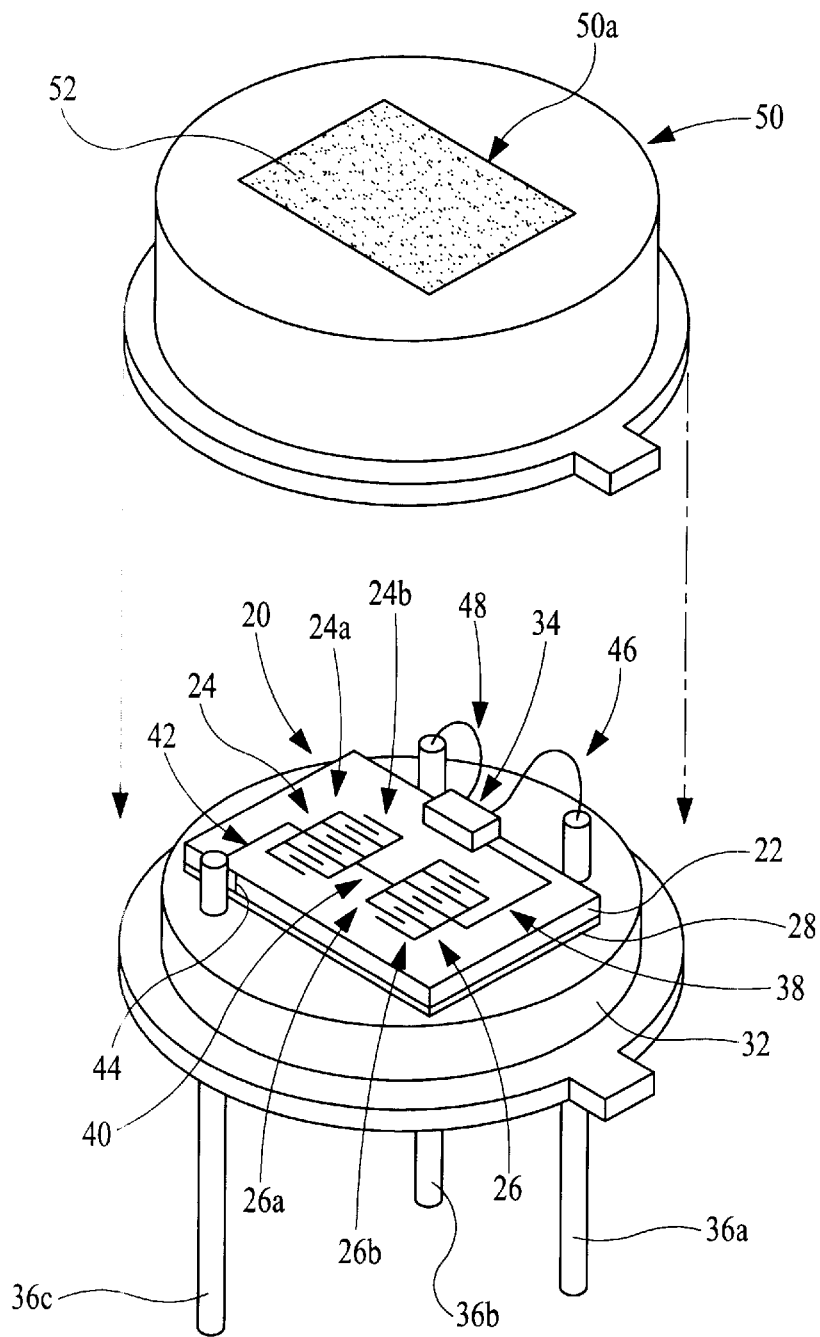
FIG. 3 is an exploded view of a pyroelectric infrared sensor module including therein a pyroelectric infrared sensor device in accordance with a second embodiment of the invention.

Turning now to FIG. 3, a pyroelectric infrared sensor module structure in accordance with a second embodiment of the invention is generally designated by numeral 30. This sensor module 30 includes a pyroelectric infrared sensor device 20 mounted on a support base plate 32 called the stem. The sensor device 20 is similar to that shown in FIG. 1 with a series combination of two comb-shaped electrode pairs 24, 26 patterned on a pyroelectric substrate 22 of rectangular planar shape. The sensor device 20 with such serially coupled comb-shaped electrode pairs 24, 26 may be called the "dual comb-shaped electrode sensor" in some cases.

More specifically, as shown in FIG. 3, the pyroelectric infrared sensor device 20 includes on the top surface of the pyroelectric substrate 22 two pairs of comb-shaped electrodes 24, 26, each of which electrodes has five parallel open-ended fingers spatially mated or interdigitated in relation to those of its associated comb-shaped electrode on substrate 22. These comb-shaped electrode pairs 24, 26 are centrally disposed on substrate 22 and are electrically coupled in series to each other. The substrate 22 is polarized by the pair of comb-shaped electrode pairs 24, 26. The substrate 22 has an opposite or bottom surface not visible in FIG. 3, which is entirely covered with an electrode 28 so that it has portions opposing comb-shaped electrode pairs 24, 26. Substrate 22 is mounted on the stem 32 with a thin dielectric film sheet member (not shown) being laid therebetween.

As shown in FIG. 3, a field effect transistor (FET) 34 is mounted on the top surface of the pyroelectric substrate 22 such that FET 34 is disposed near one elongate peripheral side edge of substrate 22 with a certain distance being defined between it and comb-shaped electrode pairs 24, 26 as shown. The stem 32 on which substrate 22 is insulatively mounted has a predetermined number—three, here—of upstanding linear conductive pins 36a, 36b, 36c acting as terminals for electrical connection with external circuitry on a printed circuit board (PCB) operatively associated with the sensor module 30.

On the substrate 22 of the pyroelectric infrared sensor device 20, the FET 34 has a gate node electrically interconnected through a lead pattern 38 to a first set of parallel fingers 26b of the comb-shaped electrode 26 in one pair. A second set of fingers 26a of this comb-shaped electrode 26 are connected via an intermediate lead 40 to first fingers 24b of one comb-shaped electrode 24 in the other pair. The second fingers 24a of the remaining comb-shaped electrode 24 are connected via a lead 42 to a connection pad 44 called the "side electrode." This electrode 44 is on the opposite side wall of substrate 22 opposing the FET mount side edge thereof. Side electrode 44 elongates along the thickness of substrate 22 as shown in FIG. 3. The drain node of FET 34 is connected via a conductive bonding wire 46 to one terminal pin 36a. The source of FET 34 is connected via a wire 48 to another terminal pin 36b. The remaining terminal pin 36c is used as the ground terminal, which is in electrical contact with the side electrode 44 of substrate 22 through a conductive adhesive (not shown).

Still referring to FIG. 3, the stem 32 with substrate 22 thereon is assembled with a can casing 50 providing an environmentally sealed interior space in which the pyroelectric sensor device 20 is packed. The can casing 50 may be of a hat-like shape as shown. Can casing 50 has a circular top surface or "ceiling" in which a rectangular opening 50a is centrally defined as a radiation entrance window. An optical filter 52 is rigidly attached on the inner surface of the cap ceiling to cover opening 50a thereby allowing incoming rays of infrared light to enter through optical filter 52 to hit the underlying pyroelectric sensor device 20 sealed inside of an enclosure as constituted by the can casing 50 and stem 32 after assembly. Optical filter 52 may be a 5 micrometers cut-on optical filter, by way of example.

Figure 4:
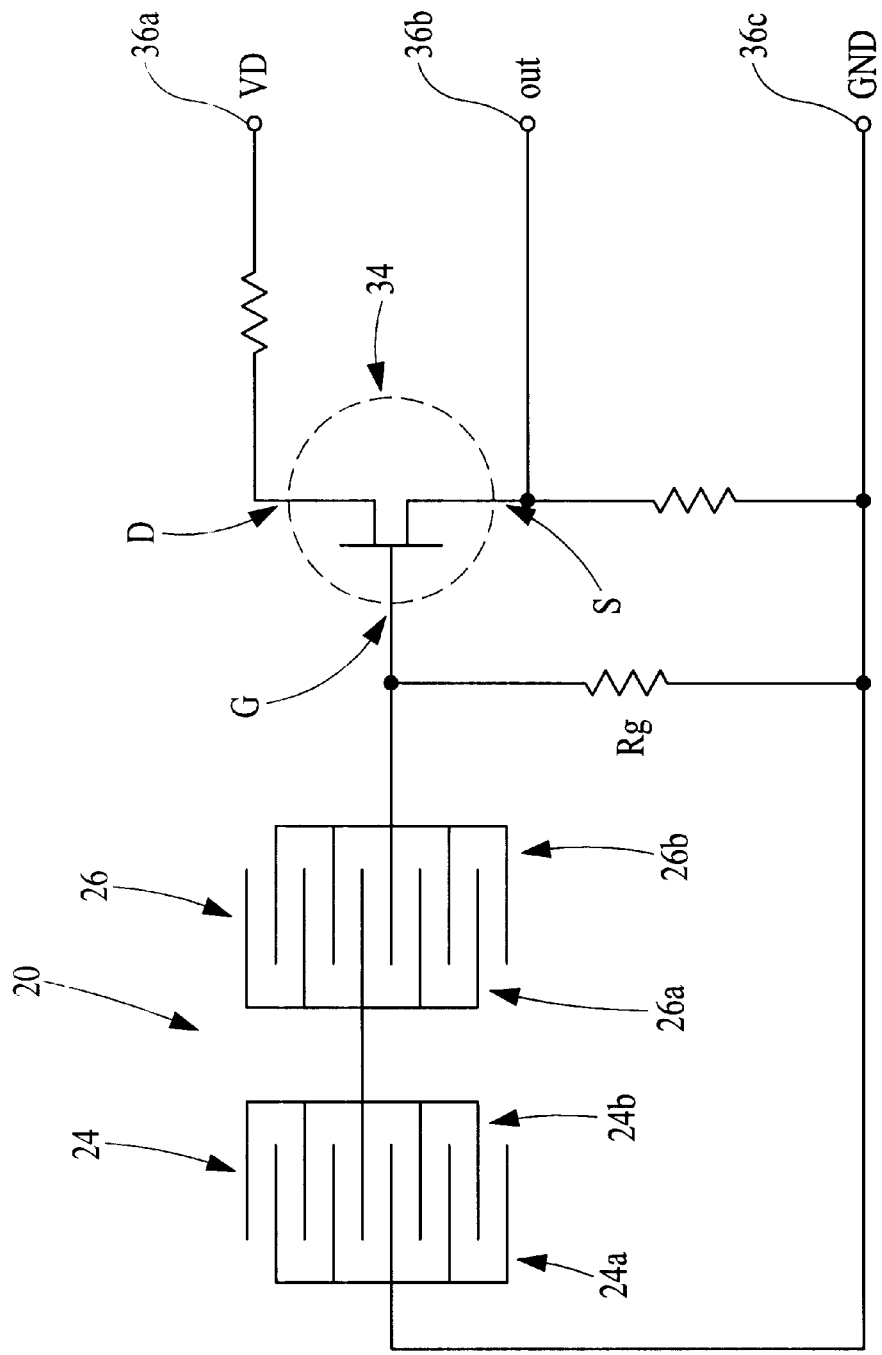
FIG. 4 shows electrical equivalent circuitry of the pyroelectric infrared sensor module shown in FIG. 3.

The pyroelectric infrared sensor assembly or package 30 of FIG. 3 has electrical equivalent circuitry as shown in FIG. 4. When rays of infrared light are introduced which may be radiated from an object being detected, such as a moving target human body, thermal or heat energy is given to the radiation sensitive surface—i.e. the top surface of substrate 22 with the series combination of comb-shaped electrode pairs 24, 26 formed thereon—of the built-in pyroelectric sensor device 20. When this is done, sensor device 20 produces a corresponding amount of pyroelectric current. This pyroelectric current produced is obtainable as a voltage by passing to through a synthesis resistance of an FET gate coupled resistor Rg and an inherent resistance of the pyroelectric infrared sensor device 20. The resulting voltage is then input to the gate (G) of FET 34. At this time, a bias voltage is applied to the drain (D) of FET 34 whereas the source (S) of FET 34 is coupled to ground. The pyroelectric current as derived at infrared sensor device 20 is impedance-converted by the sensor device 20, resistor Rg and FET 34, and a detection voltage signal is then generated at output terminal pin 36b.

Figure 5A:
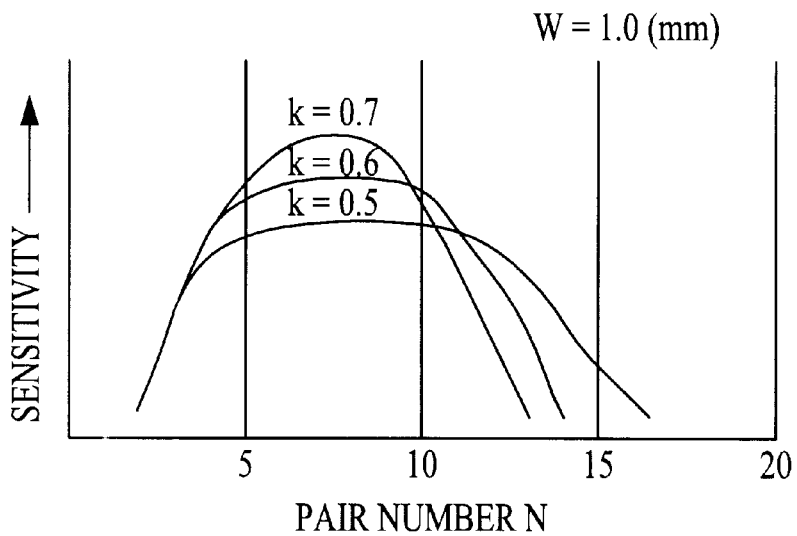
Figure 5B:
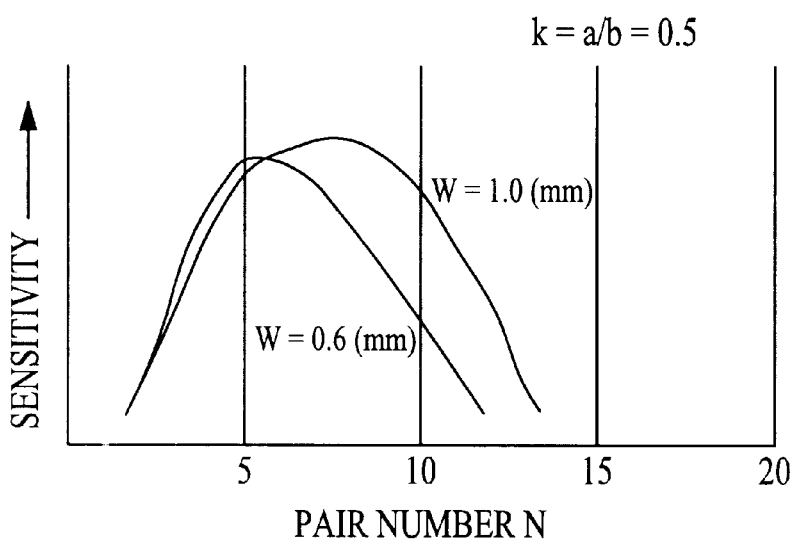

See graphs shown in FIGS. 5A and 5B, which experimentally demonstrate that the pyroelectric infrared sensor module 30 of FIG. 3 has increased sensitivity. More specifically, the experiments have been done using several dimension parameters of sensor module 30, including the finger pair number N of the comb-shaped electrode pairs, the ratio k of the finger gap a to the finger pitch b as given by k=a/b, and the finger interdigitation width W, each of which was varied in value as follows. The graph of FIG. 5A shows the relation of resultant sensitivity versus finger pair number N when the finger gap-to-pitch ratio k was changed in value from 0.5 through 0.6 to 0.7 with the interdigitation width W kept constantly at 1.0 mm. The graph of FIG. 5B indicates variations of the sensitivity when the interdigitation width W was changed between 0.6 mm and 1.0 mm with the value of k fixed at 0.5. As can be readily seen from these experimental results, it has been found that the pyroelectric infrared sensor module 30 of FIG. 3 could exhibit good sensitivity especially when N is greater than or equal to three (3) and simultaneously a goes beyond 100 micrometers in value.

One significant advantage of this pyroelectric infrared sensor module 30 is that since the comb-shaped electrode pairs 24, 26 for permitting polarization in the pyroelectric substrate 22 are formed on the surface of substrate 22 serving as the infrared light receiving plane, it becomes possible to catch the thermal energy of infrared light at or near only the top surface of substrate 22. For this reason, sensor module 30 may function as a pyroelectric infrared sensor that does no longer depend upon the thickness direction of its pyroelectric body unlike the prior art as discussed in the introductory part of the description.

Another advantage of this embodiment sensor module 30 lies in its capability of attaining, due to the presence of the opposite electrode 28 having portions opposing the comb-shaped electrode pairs 24 and 26, dipole concentration between the fingers 24a and 24b of the comb-shaped electrode pair 24 as well as between the electrode fingers 26a and 26b of comb-shaped electrode pair 26. This in turn makes it possible to increase the polarization rate of comb-shaped electrode pairs 24, 26. Moreover, it is also possible to increase the electrical capacitance (electrostatic capacitance) between the comb-shaped electrode pairs 24, 26 and opposite electrode 28. Accordingly, sufficient pyroelectric current is obtainable while at the same time rendering the S/N ratio excellent. As a consequence, with the pyroelectric infrared sensor module 30 of this embodiment, further improved sensitivity can be expected.

Still another advantage of the embodiment 30 is that since the opposite electrode 28 having portions insulatively overlapping the comb-shaped electrode pairs 24, 26 is on the bottom surface of the substrate 22, the electric resistance of the pyroelectric infrared sensor device 20 can be further decreased as a whole.

Therefore, it becomes possible to eliminate use of an external resistor to be provided between the gate (G) of FET 34 and the ground (GND). Note here that the resistor Rg in the electrical equivalent circuit diagram of FIG. 4 can be a mere symbolic representation of the inherent resistance of pyroelectric infrared sensor device 20, and not any discrete element to be separately coupled thereto.

Yet another advantage of module 30 is that the pyroelectric infrared sensor device 20 used therein does not operationally depend upon the thickness direction of the pyroelectric substrate 22; therefore, it is no longer necessary for substrate 22 to be much reduced in thickness. Accordingly, the mechanical and thermal strength may be enhanced thereby eliminating, or at least greatly suppressing, any possible degradation of the electrical characteristics otherwise occurring due to a decrease in substrate thickness.

One advantage of infrared sensor device 20 lies in that the comb-shaped electrode pairs 24, 26 are on the surface of the pyroelectric substrate 22 acting as the infrared light receiving plane, thereby making it possible to integrally form electrical circuitry with substrate 22 on the infrared light receiving surface thereof. Also, since all of the currently available lithography techniques widely employed in the IC fabrication field are directly applicable without any modifications as the formation methodology of comb-shaped electrode pairs 24, 26, it is possible to readily fabricate the infrared light receiving section with reduced complexity. Yet further, a pyroelectric substrate support plate is no longer required while simultaneously rendering it unnecessary to perform a variety of kinds of complicated support methods for support of such pyroelectric substrate as well as any extra thermal insulation schemes.

As a consequence, with the pyroelectric infrared sensor device 20, reducing complexity of manufacture and parts in number may make it possible to enhance the electrical reliability and manufacturability with production costs reduced.

Figure 6:
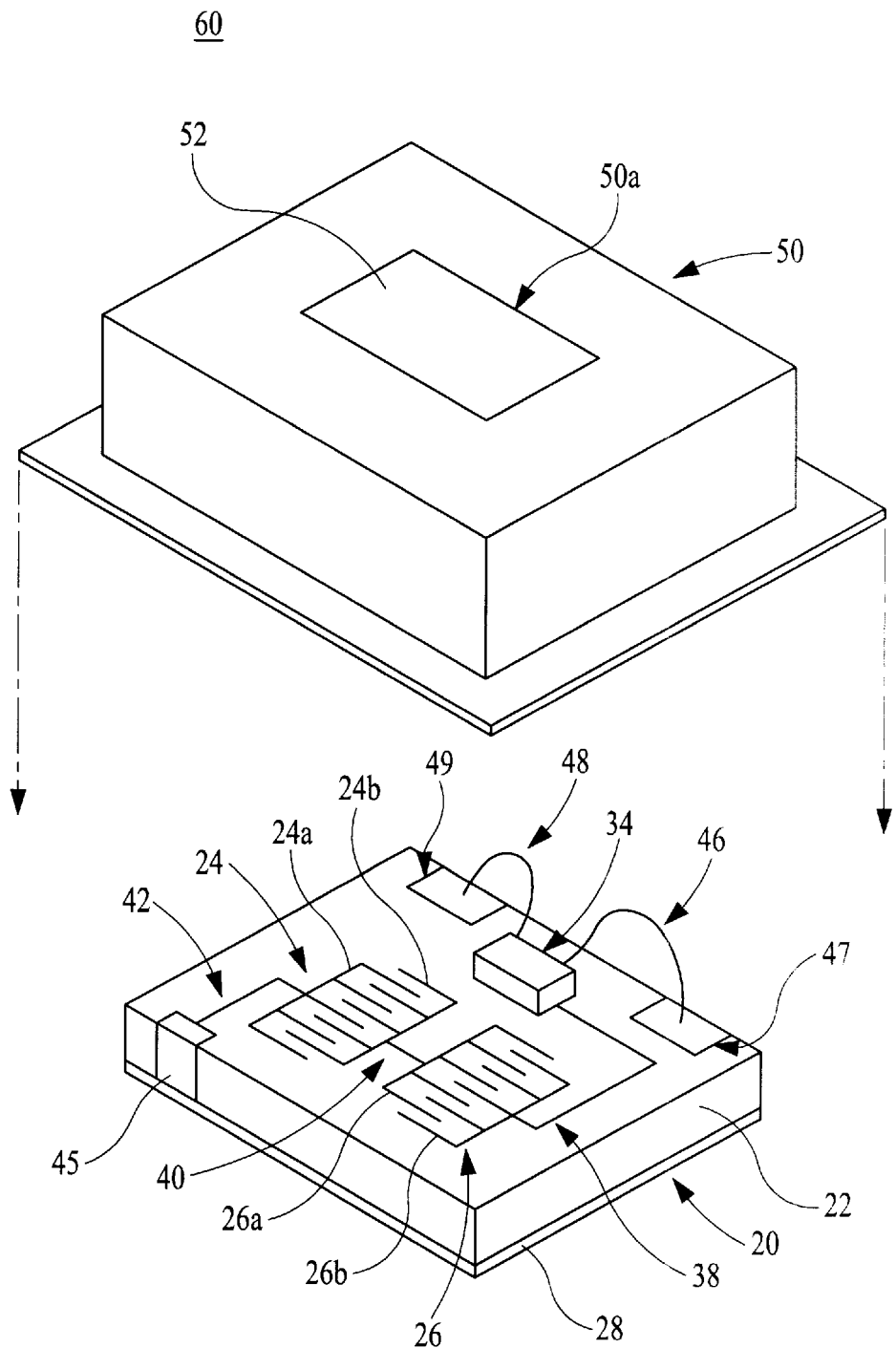
FIG. 6 is an exploded view of a pyroelectric infrared sens module in accordance with a third embodiment of the invention.

A pyroelectric infrared sensor module in accordance with a third embodiment of the invention is shown in FIG. 6. This module is generally designated by numeral 60 as shown. While the previous sensor module 30 of FIG. 3 is of the hermetic seal-type, module 60 shown in FIG. 5 is of the surface-mount component type in structure. In FIG. 6, like parts or components are indicated by like reference characters for purposes of explanation only.

Principally, the pyroelectric infrared sensor module 60 of FIG. 6 is similar to that shown in FIG. 3 with the can casing 50 being modified in shape and also with the terminal pins 36a to 36c being deleted moreover with the FET 34 being modified in electrical interconnection scheme relating to the source, drain and gate thereof. As illustrated, can casing 50 resembles in outer appearance a thin rectangular box, rather than the hat shown in FIG. 3. The drain, source and gate of FET 34 are respectively connected to external electrode pads which are distributed at specified locations on the pyroelectric substrate 22 as will be described in detail below. Still referring to FIG. 6, the rectangular pyroelectric substrate 20 has three electrode pads 45, 47, 49. Pads 47, 49 are for electrical interconnection with the FET 34 mounted on substrate 20, and are formed along one of the longitudinal opposite side edges of substrate 22 with a certain distance defined therebetween. These pads 47, 49 are electrically connected by lead wires 46, 48 to the drain and source of FET 34. Pad 47 serves as an input terminal whereas pad 49 acts as an output terminal. The remaining pad 45 is formed at the other longitudinal substrate side edge so that it faces pad 49 across the width of substrate 22. Pad 45 also extends on a corresponding portion of the side wall of substrate 22 as shown. Pad 45 acts as the ground terminal. This pad is electrically coupled to the gate of FET 34 through a series combination of two comb-shaped electrode pairs 24, 26. Specifically, ground pad 45 is connected via an on-surface lead pattern 42 to first fingers 24a of one comb-shaped electrode pair 24, which has second fingers 24b connected by an intermediate on-surface lead 40 to the first fingers 26a of the other comb-shaped electrode pair 26. The second fingers 26b thereof are electrically coupled via an on-surface lead pattern 38 to the gate of FET 34.

Figure 7:
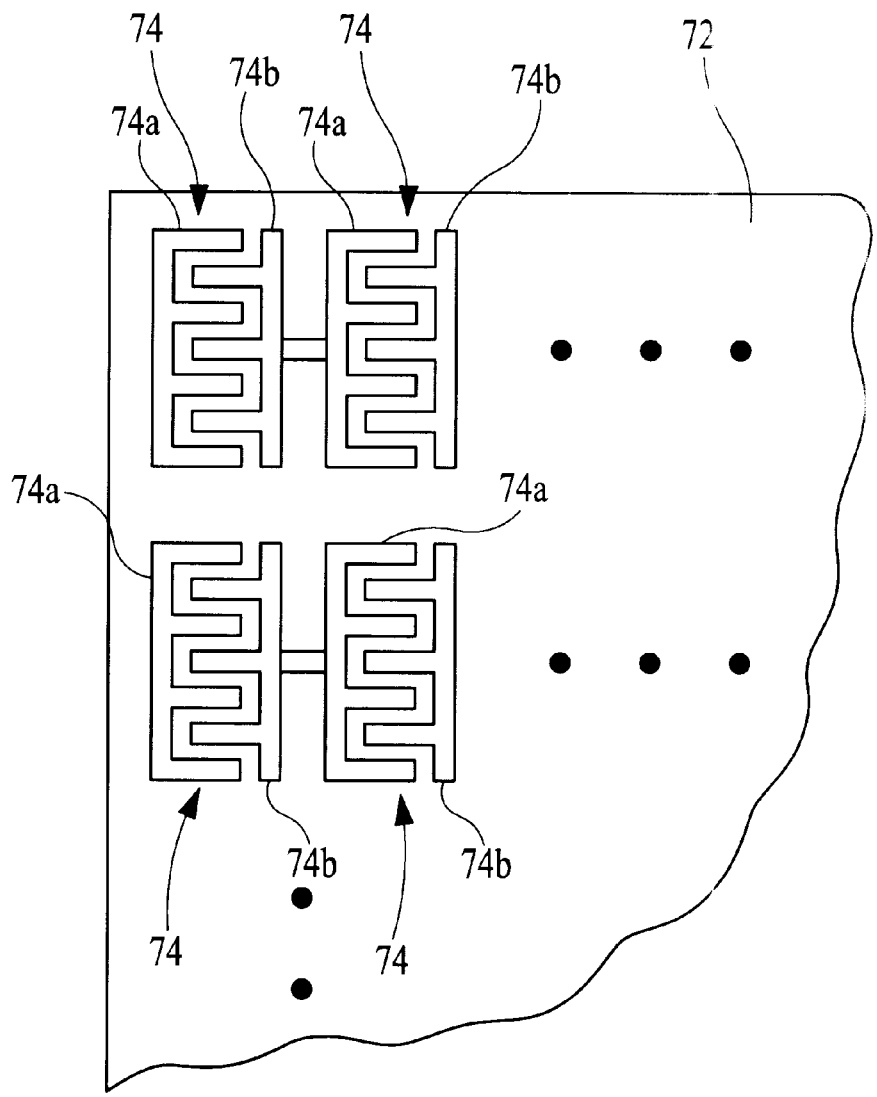
FIGS. 7 and 8 are partly enlarged plan views of other pyroelectric infrared sensor devices also embodying the invention.

Turning now to FIG. 7, a main part of a pyroelectric infrared sensor device 70 in accordance with a still further embodiment of the invention is shown. The infrared sensor device 70 is similar to the device 20 shown in FIG. 3 with the comb-shaped electrode pairs 24, 26 being replaced by an array of rows of comb-shaped electrode pairs 74. More specifically, a plurality of series combination of comb-shaped electrode pairs 74 are provided in a serial or parallel fashion on the light-receiving surface of a pyroelectric substrate 72. Each comb-shaped electrode pair 74 in each row comprises two conductive comb-shaped electrode patterns 74a, 74b each having a selected number—three or greater—of parallel open-ended fingers. Comb-shaped electrode 74a has four fingers including its outermost ones whereas electrode 74b has three fingers each of which is positioned between a pair of successive fingers of its associated comb-shaped electrode 74a. The substrate 72 has a similar bottom-surface electrode (not visible in FIG. 7) which has portions opposing the array of serial/parallel comb-shaped electrode pairs 74.

With such an arrangement, since an increased number of serially coupled comb-shaped electrode pairs 74 are grouped in parallel rows on the infrared light receiving surface of substrate 72 while allowing each pair to function as a radiation sensitive element, any intended pyroelectric current responsive to irradiation of incoming rays of infrared light is obtainable due to thermal conversion at or near substantially only this substrate surface. This may advantageously serve to minimize or at least greatly reduce occurrence of crosstalk between adjacent ones of the comb-shaped electrode pairs 74. Accordingly, it becomes possible to maximize or at least greatly enhance detection accuracy while simultaneously enabling successful acquisition of one-dimensional or two-dimensional images with less or no crosstalk by letting in the infrared light interrupted by a chopper, for example.

The array of multiple comb-shaped electrode pair rows 74 shown in FIG. 7 is modifiable such that all of their first fingers 74a are connected together while causing the second fingers 74b thereof to be subdivided into rows and columns of blocks each of which includes commonly coupled second fingers. This arrangement makes it possible to more accurately detect movement of an object under detection.

Figure 8:
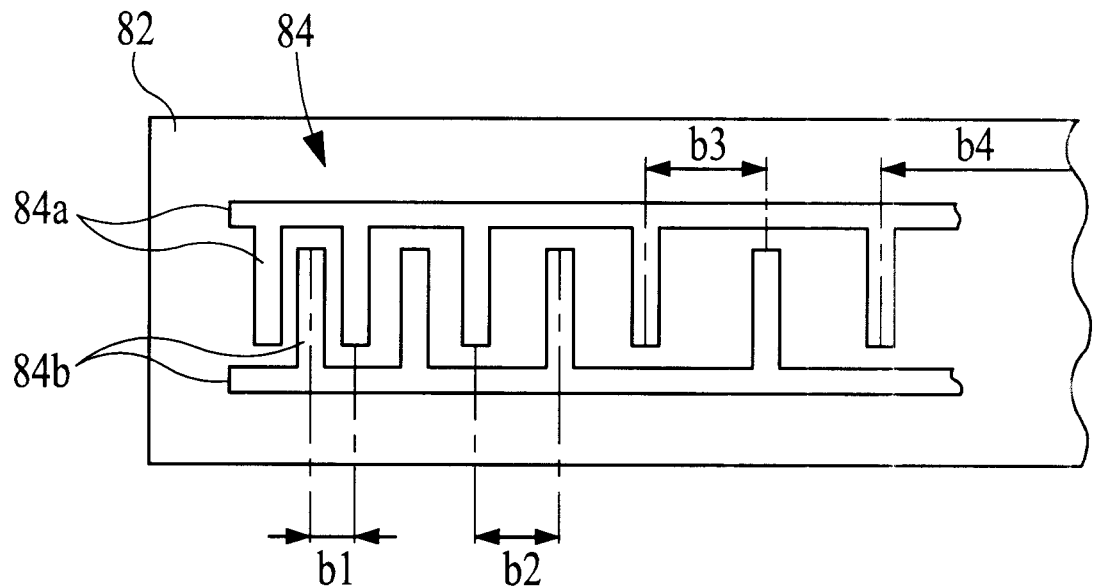

A pyroelectric infrared sensor device 80 also embodying the invention is shown in FIG. 8. As shown, infrared sensor device 80 is similar to the device 10 of FIG. 1 with the electrode fingers 14a, 14b being replaced with fingers 84a, 84b which are variable in distance or interval between adjacent fingers i.e., in their finger pitch b. More specifically, sensor device 80 includes a pyroelectric substrate 82 having a pair of comb-shaped electrodes 84. Each electrode includes a preselected number—three or more—of parallel open-ended fingers 84a or 84b consecutively coupled together at one end. Electrode fingers 84a and 84b are spatially interdigitated with each other as shown in FIG. 8. These fingers are different or "variable" in pitch b in such a way that pitch values b1, b2, b3, b4, . . . are sequentially incremented along the length of substrate 82 as defined by the direction X in FIG. 8. Such sequential increase in pitch value b causes the gap defined between one finger 84b and its associated pair of fingers 84a to gradually increase in the direction X. Substrate 82 has a similar bottom-surface electrode (not visible in FIG. 8) having portions opposing comb-shaped electrodes 84.

Figure 9:
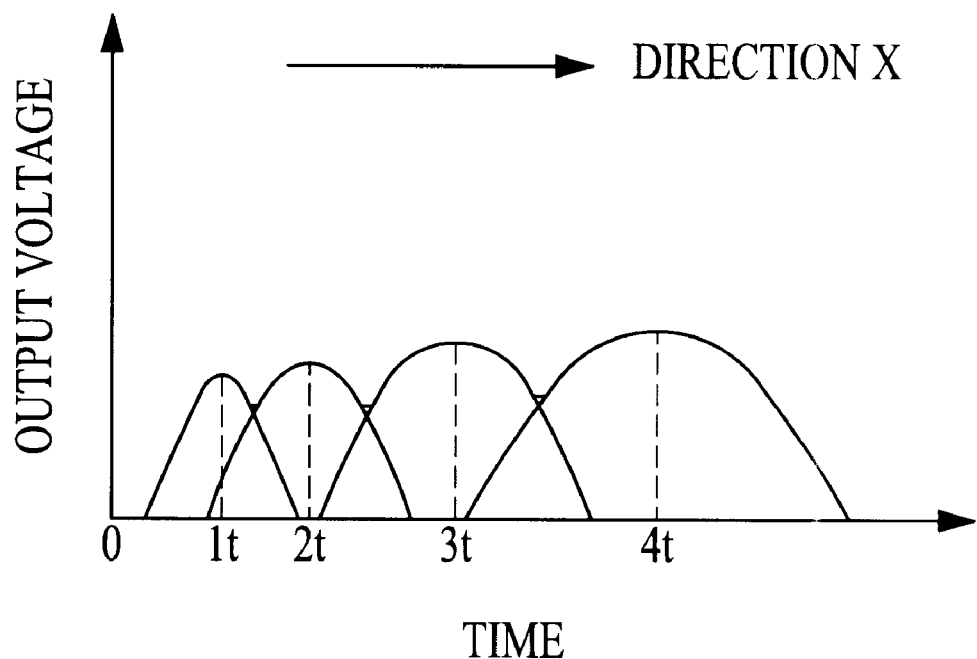
FIG. 9 is a graph demonstrating how the time constant changes with time by showing the relation of an output voltage of the sensors of FIG. 8 versus elapsed time upon irradiation of incoming infrared light from a moving object under detection.

With the electrode finger pitch b varied, an output voltage of the infrared sensor device 80 may vary with time as shown in FIG. 9, which demonstrates variations of the time constant—this factor may correspond to a maximal deviation or difference between a time change of incident rays of infrared light and actual issuance of an electrical output signal responding thereto—upon irradiation of infrared light onto the top surface of substrate 82 with comb-shaped electrode pair 84 formed thereon.

More specifically, suppose that infrared light radiated from a target object, such as a human body, is incident on the substrate surface of sensor device 80. Imagine that the object is moving. Consider that as the object moves, a spot or beam of incident infrared light hitting sensor substrate 82 moves along the direction X. In this situation the resultant energy due to the infrared light becomes different in amount for each respective pair of interdigitated fingers 84a, 84b of comb-shaped electrodes 84 through which it passes. In other words, as can be readily seen by those skilled in the art by comparatively viewing FIGS. 8 and 9, as a beam spot of incident infrared light on substrate 82 moves along the length of substrate 82 in the direction X, the resulting thermal energy produced therein becomes different in intensity for each respective one of electrode fingers 84a of variable pitch the spot crosses, thereby causing a corresponding sensor output voltage to vary in waveform. Such output voltage variation may force the time constant—namely, the time taken from incidence of infrared light to issuance of an electrical output signal in response thereto—to increase accordingly, as well demonstrated by the graph of FIG. 9. It is thus possible for sensor 80 to offer increased sensitivity in low-frequency bands in particular. This may in turn enable attainment of maximized detectability with respect to slow or moderate movement of an object being detected, in cases of detection of people who are walking slowly, by way of example.

Summarizing the above-described operation of the infrared sensor, when the infrared sensor receives infrared light radiated from a target object, the light is focused by a lens (not shown in the drawings) to obtain a spot of light on the substrate surface of the sensor device 80. The spot is set to move on the substrate along the direction X as the object moves. When the electrode pitch of the comb-shaped electrode is varied, a volume of the pyroelectric member between the electrode fingers is also varied. If the volume is small, the total detected amount of electricity is small, and the response of the detection is fast. On the other hand, if the volume is large, the detected amount of electricity is large and the response of the detection is slow. Therefore, when the speed of movement of the target object changes, the electrode pitch providing best performance also changes. By providing various electrode pitches to the comb-shaped electrode, the infrared sensor device can have good performance for various speeds of movement of the target object.

Figure 10A:
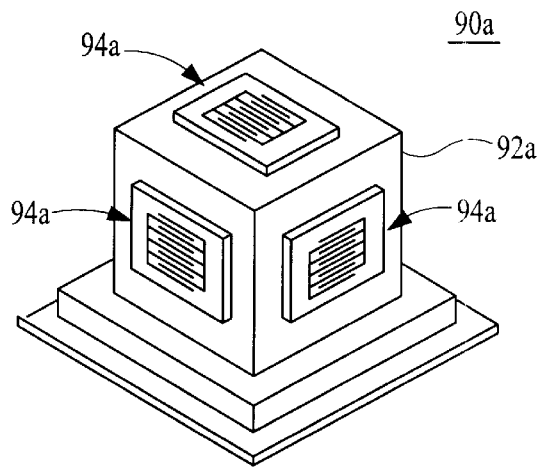
FIGS. 10A to 10C illustrate perspective views of several additional pyroelectric infrared sensor devices also embodying the invention.
Figure 10B:
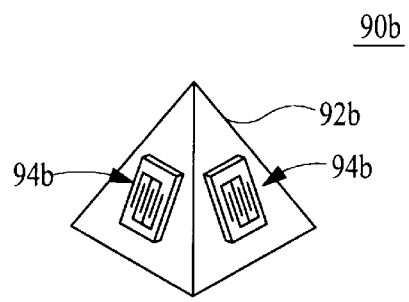
Figure 10C:
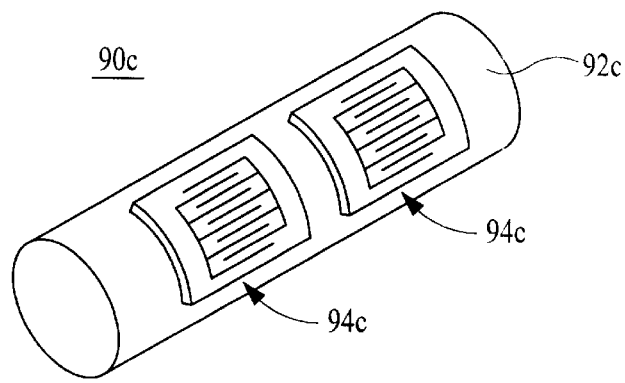
Figure 11:
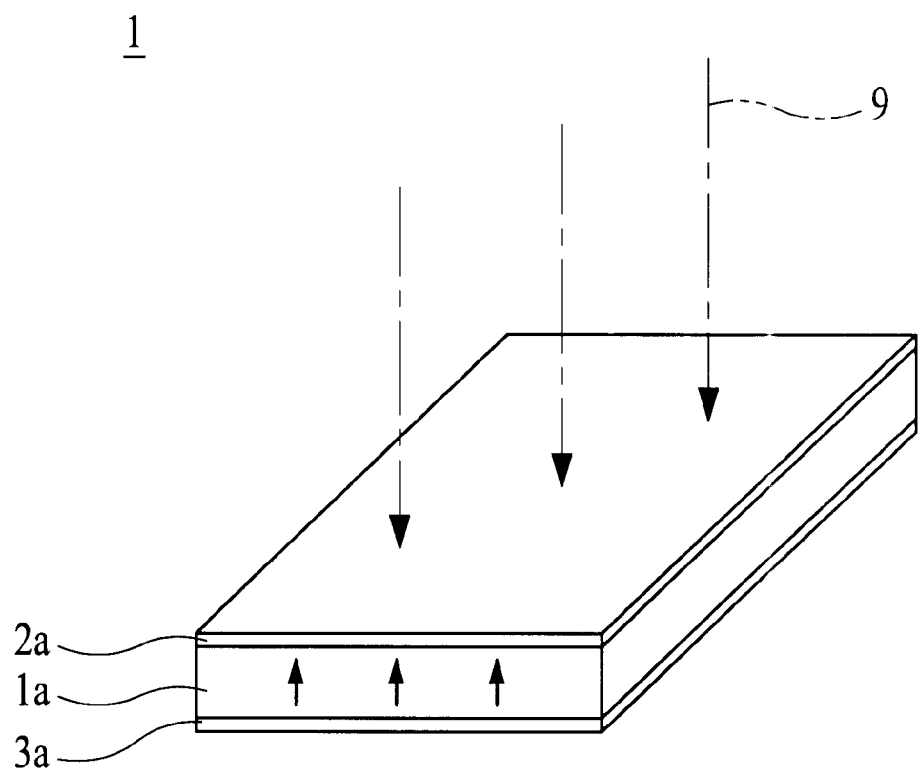
FIG. 11 swows a perspective view of one conventional pyroelectric infrared sensor device.
Figure 12A:
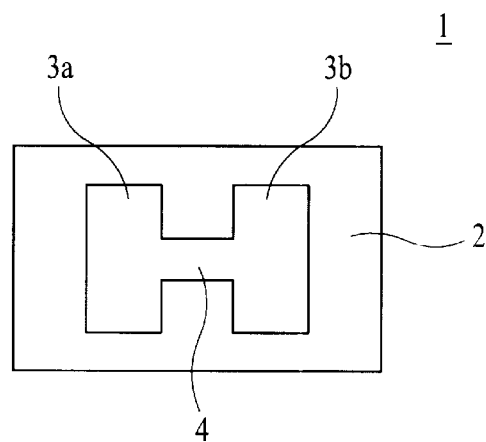
Figure 12B:
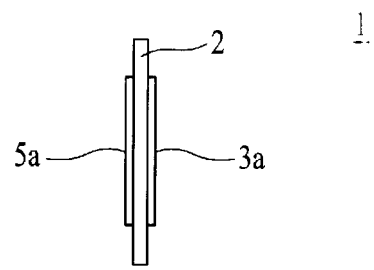
Figure 12C:
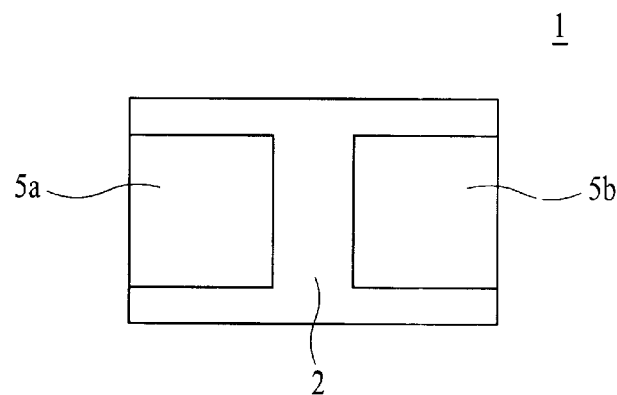
Figure 13:
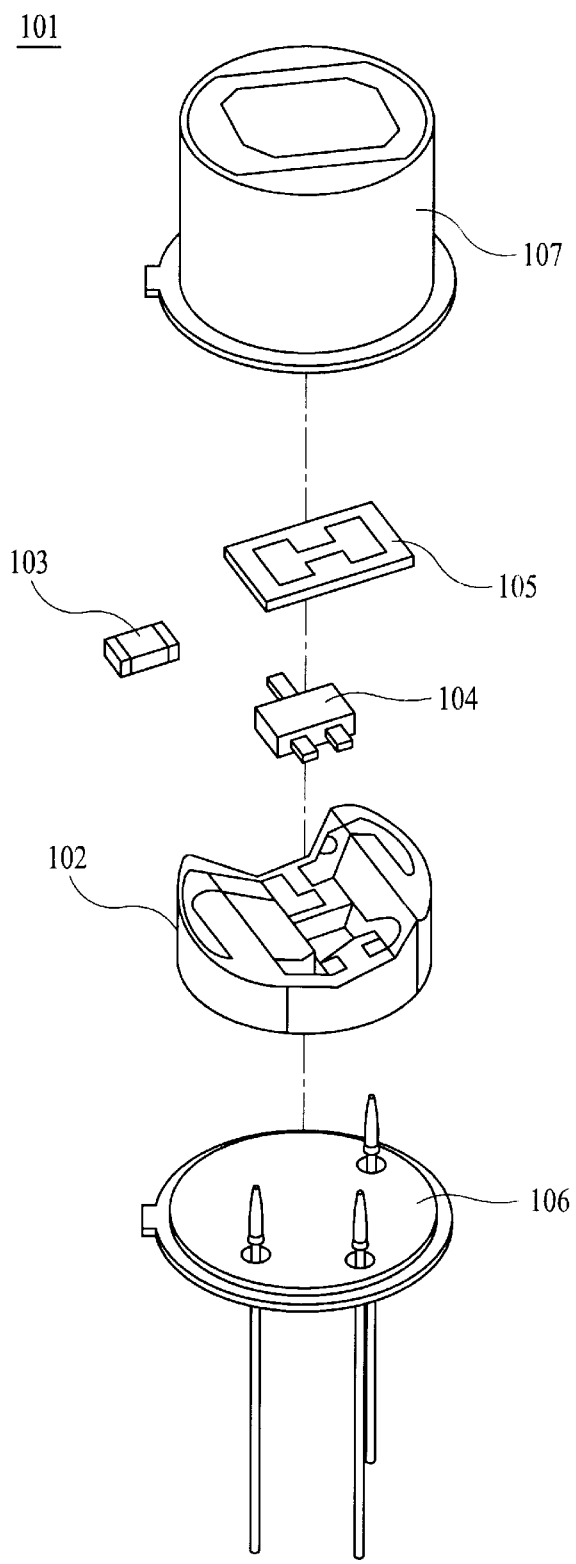
FIG. 13 is an exploded view of one conventional pyroelectric infrared sensor module making use of the sensor device shown in FIG. 12.
Figure 14A:
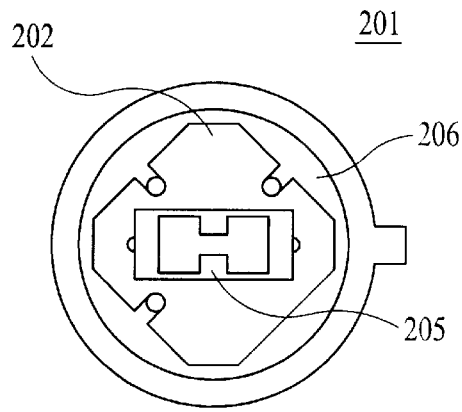
Figure 14B:
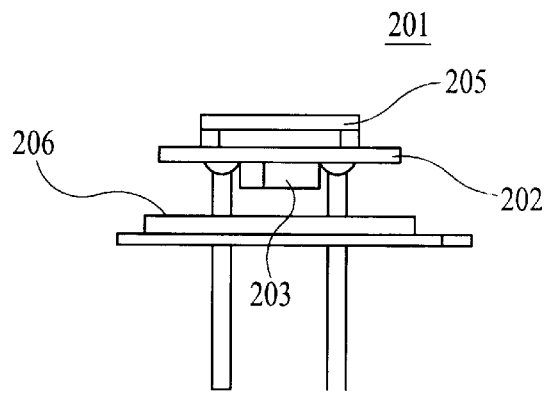
Figure 14C:
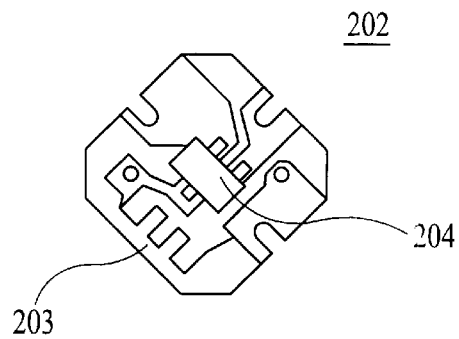
Figure 15:
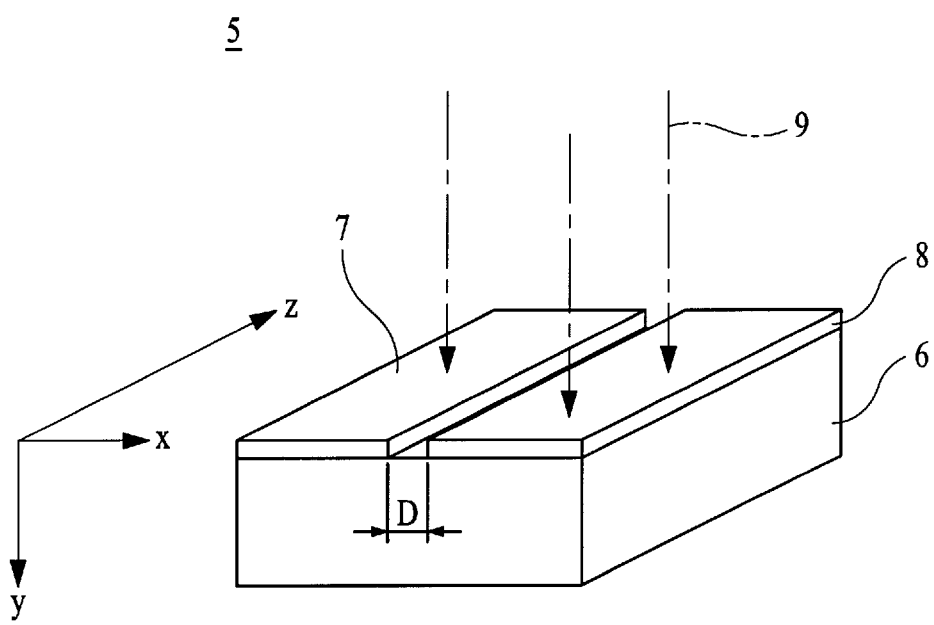
FIG. 15 shows a perspective view of a further conventional pyroelectric infrared sensor device.

Some other embodiments or modifications also embodying the principles of the invention are shown in FIGS. 10A to 10C. A feature of these infrared sensor devices is the employment of three-dimensional (3D) structures as will be set forth in detail below.

A pyroelectric infrared sensor device 90A shown in FIG. 10A includes a cubic support base structure 92a having top and bottom square planes as well as four side walls on which pyroelectric sensor substrates 94a are centrally mounted by adhesion except for the bottom. Cubic base 92a may be made of insulative materials. Each sensor substrate 94 is similar in structure and function to that shown in FIG. 1, by way of example. With such 3D sensor structure, multidirectional detection is attainable by use of a single device. For instance, the exact movement direction of an object being detected is accurately detectable while reducing complexity.

A pyroelectric infrared sensor device 90B shown in FIG. 10B includes a triangular pyramid support base structure 92b with three slanted side walls on which sensor substrates 94b are centrally placed respectively. With such an arrangement, similar advantages are attainable.

A pyroelectric infrared sensor device 90C shown in FIG. 10C includes a cylindrical support base structure 92c with a circumferential side surface on which spacedpart sensor substrates 94c are mounted along the axis thereof. With such an arrangement, similar advantages are also attainable.

In each of the devices 90A to 90C, the 3D support bases 92a to 92c may alternatively be made of a chosen pyroelectric material on which required comb-shaped electrode pairs are directly formed. Obviously, these bases may also be of other shapes, such as rectangular solids, pyramids, circular cones, and the like.

Although the invention has been disclosed and illustrated with reference to particular embodiments, the principles involved are susceptible for use in numerous other embodiments, modification and alterations which will be apparent to persons skilled in the art to which the invention pertains. The invention, therefore, is not to be limited by the specific disclosure herein.

What is claimed is:

1. A pyroelectric infrared sensor device comprising:
   a substrate of a pyroelectric material having one principal plane and a remaining principal plane, the one principal plane being adapted to receiving rays of infrared light;
   a pair of interdigitated comb-shaped electrodes on the one principal plane of said substrate;
   the substrate being polarized in selected directions responsive to the comb-shaped electrodes, and
   an electrode formed on the remaining principal plane of said substrate and having a portion opposing said comb-shaped electrodes;
   wherein said comb-shaped electrodes are at least partly variable in electrode pitch.

2. The device according to claim 1, wherein each of said comb-shaped electrodes has three or more electrode fingers.

3. The device according to claim 1, wherein a plurality of said comb-shaped electrode pairs are electrically connected on said one principal plane of said substrate.

4. The device according to claim 1, wherein an interelectrode distance, between adjacent pairs of electrode fingers respectively included in said pair of comb-shaped electrodes is greater than 100 micrometers.

5. The device according to claim 4, wherein each of said comb-shaped electrodes has three or more electrode fingers.

6. A pyroelectric infrared sensor device comprising:
   a substrate made of a pyroelectric material having a first surface and a second surface, the first surface acting as a radiation sensitive plane of said device;
   a pair of first and second electrode patterns on said first surface of said substrate, each said electrode pattern having a set of a specified number of parallel open-ended finger portions, at least one of the fingers of the first electrode pattern being positioned between a pair of successive fingers of the second electrode pattern;
   a conductive layer on at least part of the second surface of said substrate, said layer at least partly overlapping said first and second electrode patterns; and
   conductors connected for electrically activating said first and second electrode patterns for allowing said pyroelectric material to be polarized; wherein said fingers are at least partly variable in interval between adjacent ones thereof.

7. The device according to claim 6, wherein the specified number is three or more.

8. The device according to claim 7, wherein adjacent pairs of electrode fingers included respectively in said first and second electrode patterns are spaced substantially at least 100 micrometers apart.

9. The device according to claim 6, wherein said fingers are successively increased in interval in a specified direction.

10. The device according to claim 6, further comprising:

another pair of third and fourth electrode patterns each having a set of parallel open-ended fingers and being electrically coupled to the first and second electrode pattern pair on said first surface of said substrate.

11. The device according to claim 10, wherein said another pair of third and fourth electrode patterns is connected in series to said first and second electrode pattern pair.

12. The device according to claim 10, wherein said another pair of third and fourth electrode patterns is connected in parallel with said first and second electrode pattern pair.

13. In a radiation sensitive module having an enclosure defining therein an interior space and having an opening permitting entrance of incoming radiation into the interior space, an optical filter at said opening, a pyroelectric infrared sensor device in said interior space, said device optically coupled to said filter, electronics operatively associated with said device, and conductors for providing electrical connection between said device and said electronics as well as external circuitry, said device comprising:

a pyroelectric substrate having a first surface and a second surface, said first surface being placed to receive radiation through said optical filter;

an array of multiple electrode pattern pairs on the first substrate surface, each said electrode pattern pair including a first pattern having a first set of spaced-apart parallel conductive open-ended fingers coupled together at one end and a second pattern having a second set of spaced-apart parallel conductive open-ended fingers coupled together at one end, the first fingers being interdigitated in relation to the second fingers with a gap defined therebetween on said first substrate surface;

a conductive layer at least partly covering said second surface of said substrate and being kept at a predefined potential while said device is rendered active, said layer at least partly overlapping said array with said substrate laid therebetween; and each of the first and second sets of fingers including a specified number of fingers, said number and said gap being selected so as to force said substrate to be at least partly polarized at or near said first surface upon application of a voltage between said first and second sets of fingers; wherein said fingers are at least partly variable in interval between adjacent ones thereof.

14. The device according to claim 13, wherein said number is three or more.

15. The device according to claim 14, wherein adjacent pairs of electrode fingers included respectively in said first and second electrode patterns are spaced substantially at least 100 micrometers apart.

16. The device according to claim 13, wherein said array includes a series combination of electrode pattern pairs on said first substrate surface.

17. The device according to claim 13, wherein said array includes a parallel combination of electrode pattern pairs on said first substrate surface.

18. The device according to claim 13, wherein said array includes rows and columns of electrode pattern pairs on said first substrate surface.

* * * * *